United States Patent [19]

Kato et al.

[11] Patent Number: 4,914,006

[45] Date of Patent: Apr. 3, 1990

[54] POSITIVE RESIST QUATERNARY AMMONIUM HYDROXIDE CONTAINING DEVELOPER WITH CATIONIC AND NONIONIC SURFACTANT

[75] Inventors: Tiharu Kato, Yokohama; Kazuyuki Saito Kawasaki; Norio Ishikawa, Souka; Kiyoto Mori, Kasukabe, all of Japan

[73] Assignees: Kabushiki Kaisha Toshiba, Kawasaki; Kanto Chemical Co., Ltd., Tokyo, both of Japan

[21] Appl. No.: 178,848

[22] Filed: Apr. 4, 1988

Related U.S. Application Data

[63] Continuation of Ser. No. 813,238, Dec. 24, 1985, abandoned.

[30] Foreign Application Priority Data

Dec. 25, 1984 [JP] Japan .................................. 59-278443

[51] Int. Cl.$^4$ ............................ G03C 5/24; G03C 5/34
[52] U.S. Cl. ...................................... 430/331; 430/326; 252/156; 252/528; 252/529; 252/547; 252/548; 252/559
[58] Field of Search ................ 430/331; 252/528, 547, 252/548, 559, 529, 156

[56] References Cited

U.S. PATENT DOCUMENTS

| | | | |
|---|---|---|---|
| 3,886,100 | 5/1975 | Yasuda et al. | 521/57 |
| 4,009,232 | 2/1977 | Shiiki et al. | 264/29 |
| 4,131,580 | 12/1978 | Emmons et al. | 524/241 |
| 4,147,545 | 4/1979 | Rowe et al. | 430/331 |
| 4,149,891 | 4/1979 | Sato et al. | 96/76 R |
| 4,163,732 | 8/1979 | Sai et al. | 252/99 |
| 4,239,661 | 12/1980 | Muraoka et al. | 430/331 |
| 4,299,941 | 11/1981 | Narisawa et al. | 526/273 |
| 4,411,981 | 10/1983 | Minezaki | 430/331 |
| 4,423,138 | 12/1983 | Guild | 430/331 |
| 4,434,009 | 2/1984 | Banba | 106/290 |
| 4,475,460 | 10/1984 | Matsumoto | 101/465 |
| 4,484,951 | 11/1984 | Uchimura et al. | 106/290 |
| 4,576,903 | 3/1986 | Baron et al. | 430/331 |
| 4,613,561 | 9/1986 | Lewis | 430/331 |
| 4,628,023 | 12/1986 | Cawston et al. | 430/331 |
| 4,649,101 | 3/1987 | Thiel et al. | 430/331 |

FOREIGN PATENT DOCUMENTS

| | | | |
|---|---|---|---|
| 124297 | 11/1934 | European Pat. Off. | 430/331 |
| 62733 | 10/1982 | European Pat. Off. | 430/331 |
| 97282 | 1/1984 | European Pat. Off. | 430/331 |
| 147074 | 11/1984 | European Pat. Off. | |
| 127171 | 12/1984 | European Pat. Off. | 430/331 |
| 59-219743 | 12/1984 | Japan | 430/331 |
| 60-223120 | 11/1985 | Japan | 430/331 |
| 1367830 | 9/1974 | United Kingdom | 430/331 |

OTHER PUBLICATIONS

Research Disclosure, Abstract #22713, 3/1983.

*Primary Examiner*—Charles L. Bowers, Jr.
*Attorney, Agent, or Firm*—Finnegan, Henderson, Farabow, Garrett and Dunner

[57] ABSTRACT

A positive resist developer comprising a solution containing a quaternary ammonium hydroxide, a cationic surfactant and a nonionic surfactant.

2 Claims, 1 Drawing Sheet

POSITIVE RESIST QUATERNARY AMMONIUM HYDROXIDE CONTAINING DEVELOPER WITH CATIONIC AND NONIONIC SURFACTANT

This application is a continuation of application Ser. No. 813,238, filed Dec. 24, 1985, now abandoned.

BACKGROUND OF THE INVENTION

1. Field of the Invention

The present invention relates to a positive resist developer and a method of developing a positive resist.

2. Description of the Prior Art

Recent advantages in the electronic industries have greatly improved the packing density and micropatterning precision of semiconductor devices. Along with these advances, positive resist materials have been mainly used rather than negative resist materials as materials used for processing semiconductor devices since positive resists have higher resolution than negative resists.

When a positive resist is irradiated with an energy beam such as light, an exposed portion is decomposed and can be removed with a developing solution. Most commercially available positive resist materials are prepared by mixing a photosensitive agent such as o-quinoediazide in cresol-novolak resin. This resist produces a carboxylic group and becomes soluble in alkalis upon radiation of light. A developer for this resist is mainly an organic alkali solution mainly containing a quaternary ammonium salt such as tetramethylammonium hydroxide or trimethylhydroxyethylammonium hydroxide.

However, when the positive resist is developed by using the developer described above, a difference between dissolution rates of an exposed portion of the resist and that of a nonexposed portion thereof is not sufficiently large, thus presenting various problems. In particular, when a resist micropattern having a line width of 1.5 μm or less is developed, a resist foot portion often remains trailed around a boundary between a resist-supporting surface and an edge of the pattern obtained by development. In order to remove such a trailing foot portion by increasing an alkali concentration of the developer, by rising a developing temperature, or by prolonging a developing time, the nonexposed portion is excessively dissolved and the pattern edges are rounded, thereby degrading the pattern precision.

SUMMARY OF THE INVENTION

It is, therefore, an object of the present invention to provide a positive resist developer which increases a difference between dissolution rates of exposed and nonexposed portions of a positive resist, and prevents trailing of the pattern edge, thereby forming a sharp resist pattern.

It is another object of the present invention to provide a method of developing a positive resist by using such a developer.

According to an aspect of the present invention, there is provided a positive resist developer comprising an aqueous solution containing a quarternary ammonium hydroxide, a cationic surfactant and a nonionic surfactant.

According to another aspect of the present invention, there is provided a method of developing a positive resist, comprising:

exposing a positive resist layer supported on a support with an energy beam carrying predetermined pattern information;

bringing the exposed positive resist layer into contact with a developer containing a quarternary ammonium hydroxide, a cationic surfactant and a nonionic surfactant; and dissolving and removing the exposed portion of the positive resist layer with the developer.

DETAILED DESCRIPTION OF THE PREFERRED EMBODIMENTS

Figure 1:
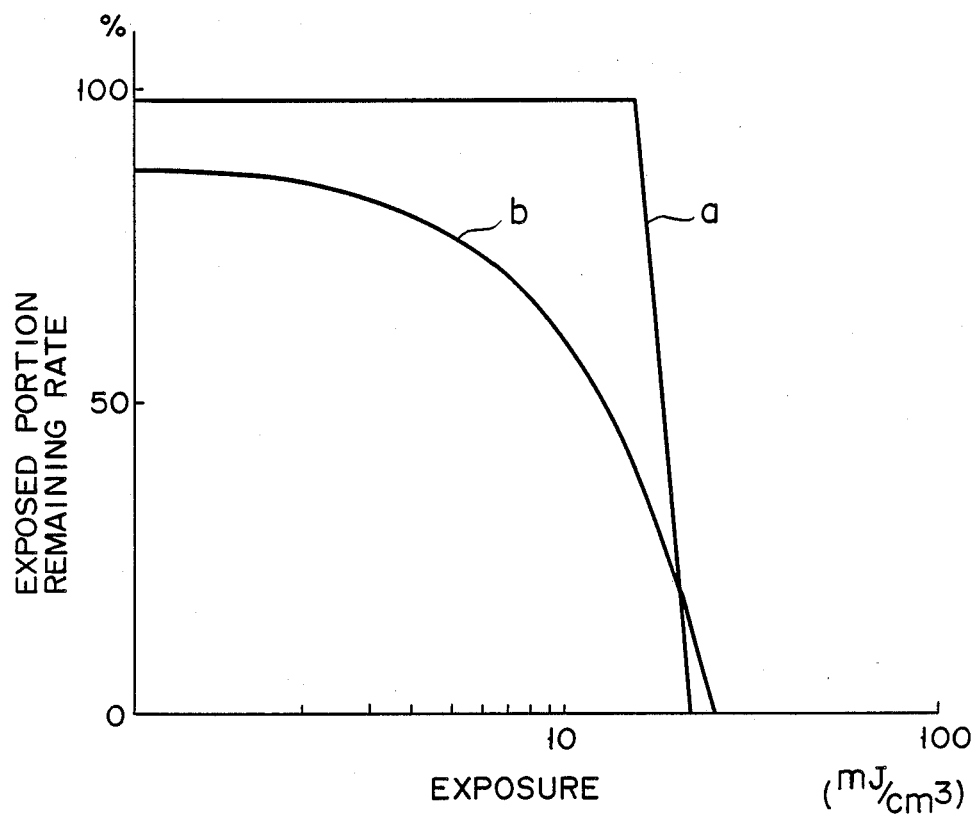
FIG. 1 is a graph showing the relationship between the exposed resist portion remaining rate and the dose when a positive resist is developed with a developer of the present invention, in comparison with the case of a conventional developer.

A positive resist developer of the present invention is an aqueous solution containing three compounds. The first component is a quarternary ammonium hydroxide which acts as an active developing component. A preferable quarternary ammonium hydroxide is represented by general formula (I) below:

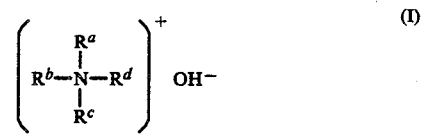

wherein $R^a$ to $R^c$ are respectively alkyl groups each having 1 to 4 carbon atoms, preferably 1 or 2 carbon atoms, and $R^d$ is an alkyl group having 1 to 4 carbon atoms, preferably 1 or 2 carbon atoms or a hydroxyalkyl group having 1 to 3 carbon atoms. Among the quarternary ammonium hydroxides of formula (I), the most preferred are the hydroxide in which $R^a$ to $R^d$ are each methyl, (tetramethylammonium hydroxide), and the hydroxide in which $R^a$ to $R^c$ are each methyl and $R^d$ is hydroxyethyl (choline), with the latter being particularly preferable.

The second component is a cationic surfactant. A preferable cationic surfactant is a quarternary ammonium salt represented by general formula (II) below:

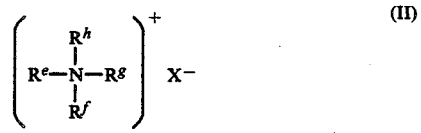

wherein $R^e$ is an alkyl group with 8 to 18 carbon atoms, $R^f$ and $R^h$ are respectively alkyl groups each having 1 to 4 carbon atoms, $R^g$ is an alkyl group having 1 to 4 carbon atoms or a hydroxyalkyl group having 1 to 4 carbon atoms, and X is a halogen atom; and/or is a pyridinium salt or picolinium salt represented by general formula (III) below:

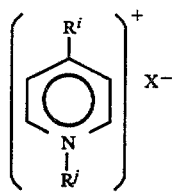

wherein $R^j$ is an alkyl group having 12 to 16 carbon atoms, $R^i$ is hydrogen atom or methyl group, and X is a halogen atom. The most preferable quarternary ammonium salt of formula (II), is that in which $R^f$ to $R^h$ are each methyl group.

The third component is a nonionic surfactant and is not limited to any specific surfactants except that it should be soluble in water. Nonionic surfactants are polyoxyethylene ethers and esters of fatty acid of polyhydric alcohol and are exemplified by the following general formulas:

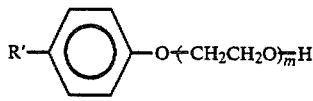

wherein R and R" are respectively alkyl groups each having 12 to 18 carbon atoms, R' is an alkyl group having 8 or 9 carbon atoms, m is the number of the repeating unit, e.g., 8 to 15, and n is the number of the repeating unit, e.g., 5 to 30. Most of these nonionic surfactants are commercially available.

The cationic and nonionic surfactants are indispensable for the developer of the present invention in addition to quarternary ammonium hydroxide. When only the cationic surfactant is mixed in an aqueous solution of quarternary ammonium hydroxide, the resultant mixture suppresses dissolution of the nonexposed portion of the positive resist and a sharp resist pattern is obtained. However, the exposed portion cannot be effectively removed during development of the positive resist, resulting in trailing. In addition, the dissolved resist is attached again to the resist pattern, thus causing roughening of the pattern surface. When the nonionic surfactant is added in addition to the cationic surfactant, the above drawback can be eliminated without losing advantage of the cationic surfactant.

The concentration of quarternary ammonium hydroxide contained in the aqueous solution constituting the developer of the invention is preferably 1 to 8% by weight, more preferably 2 to 5% by weight. The concentration of the cationic surfactant is preferably 0.001 to 0.4% by weight, more preferably 0.002 to 0.04% by weight. The concentration of the nonionic surfactant is preferably 0.01 to 0.5% by weight, more preferably 0.02 to 0.10% by weight.

The developing process of the positive resist by using the developer is performed in accordance with a known method except that the developer of the invention is used. For example, a positive resist is applied to a proper support. The support includes a semiconductor substrate, and a semiconductor substrate with an insulating layer and/or a wiring metal layer formed thereon.

The resist layer is irradiated with an energy beam which has carried predetermined pattern information as a result of passing through a photomask. The positive resist is not limited to the photoresist, so that the energy beam can be selected from light (ultraviolet or deep ultraviolet ray), an electron beam and an X-ray beam.

The positive resist as represented by a resist having cresol-novolak resin as a major constituent is decomposed only at those portions irradiated with the energy beam. After exposure, the resist layer is brought into contact with the developer of the present invention, and the decomposed portion is dissolved and removed. The developing temperature is normally 23° to 30° C., and the developing time is 0.5 to 1 minutes. As a result, the sharp resist pattern without trailing portions can be obtained.

The present invention will be described in detail by way of its examples.

EXAMPLE 1

A 1.5 μm thick positive photoresist (trade name: OFPR-800 available from Tokoyo Oka K.K.) layer was formed on a silicon dioxide film formed on a silicon substrate, and the photoresist layer was baked at a temperature of 105° C. for 90 seconds. Thereafter, the resist layer was exposed with a 1:1 projector or 5:1 stepper. The exposed structure was dipped in a developer prepared by adding 0.015% by weight of a cationic surfactant, Texnol R-5 available from Nippon Nyukazai K.K. and 0.15% by weight of a nonionic surfactant Newcol 723 available from Nippon Nyukazai K.K. in a 5.02% by weight aqueous solution of choline at a temperature of 30° C. for 30 seconds. The developed resist layer was washed with water and dried to obtain a resist pattern with a line width of 1.5 μm.

The dissolved amount of the nonexposed portion, and the ratio (selectivity) of a dissolution rate of the nonexposed portion to that of an exposed portion were measured, and the results are summarized in Table 1 below.

In Example 1, it was confirmed that the selectivity and the resist sensitivity did not substantially vary depending on the developing time.

EXAMPLE 2

0.02% by weight of dodecyltrimethylammonium chloride and 0.08% by weight of Newcal 723 were added to a 5.02% by weight aqueous solution of choline to prepare a developer. A resist pattern was prepared and developed using this developer in the same manner as in Example 1, except that a developing temperature was 25° C. The results are shown in Table 1.

EXAMPLE 3

A resist pattern was prepared and developed in the same manner as in Example 1, except that 0.04% by weight of a cationic surfactant, Coatamine 24P (tradename of dodecyltrimethylammonium chloride available from Kao Atlas K.K.) and 0.04% by weight of Newcol 723 were added to a 5.02% by weight aqueous solution of choline to prepare a developer. Results are shown in Table 1.

EXAMPLE 4

A resist pattern was prepared and developed in the same manner as in Example 1, except that 0.04% by weight of a cationic surfactant, Coatamine 24P and 0.08% by weight of a nonionic surfactant Newcol 569E available from Nippon Nyukazai K.K. were added to a 5.02% by weight aqueous solution of choline to prepare a developer. Results are shown in Table 1.

EXAMPLE 5

A resist pattern was prepared and developed in the same manner as in Example 1, except that 0.08% by weight of hexadecyltrimethylammonium chloride as a cationic surfactant and 0.04% by weight of a nonionic surfactant Newcol 565 available from Nippon Nyukazai K.K. were added to a 2.5% by weight aqueous solution of tetramethylammonium hydroxide (TMAH). Results are shown in Table 1.

EXAMPLE 6

A resist pattern was prepared and developed in the same manner as in Example 1, except that 0.04% by weight of Coatamine 24P and 0.04% by weight of Newcol 723 were added to a 3.0% by weight aqueous solution of TMAH to prepare a developer, and that a developing temperature was 25° C. Results are shown in Table 1.

EXAMPLE 7

A resist pattern was prepared and developed in the same manner as in Example 1, except that microposit 1400-27 (available from Shipley Inc.) was used as a positive photoresist, that 0.04% by weight of dodecylpyridinium chloride and 0.04% by weight of Newcol 723 were added to a 5.02% by weight aqueous solution of choline to prepare a developer, and that a developing temperature was 25° C. Results are shown in Table 1.

EXAMPLE 8

A resist pattern was prepared and developed in the same manner as in Example 7, except that 0.04% by weight of a cationic surfactant, Position BB (trade name of dodecylpicolinium chloride available from Kao Atlas K.K.) was added to a 5.02% by weight aqueous solution of choline). Results are shown in Table 1.

COMPARATIVE EXAMPLE 1

A resist pattern was prepared and developed in the same manner as in Example 1, except that a 5.02% by weight aqueous solution of choline was used as a developer. Results are shown in Table 1.

COMPARATIVE EXAMPLE 2

A resist pattern was prepared and developed in the same manner as in Example 1, except that a 2.5% by weight aqueous solution of TMAH was used as a developer. Results are shown in Table 1.

COMPARATIVE EXAMPLE 3

A resist pattern was prepared and developed in the same manner as in Example 1, except that a 3.0% by weight aqueous solution of TMAH was used as a developer. Results are shown in Table 1.

COMPARATIVE EXAMPLE 4

A resist pattern was prepared and developed in the same manner as in Example 7, except that a 5.02% by weight aqueous solution of choline was used as a developer. Results are shown in Table 1.

TABLE

| Photo-resist | Developer | Additive (Content) Cationic surfactant (Wt. %) | Additive (Content) Nonionic surfactant (Wt. %) | Dissolved amount of nonexposed portion (nm) | Selectivity *1 | |
|---|---|---|---|---|---|---|
| | | None | None | 220 | 8.0 | Comparative Example 1 |
| | Choline 5.02 (Wt. %) | Texnol R-5 (0.015) | Newcol 723 (0.15) | 20 | 75.0 | Example 1 |
| | | Dodecyltrimethylammonium chloride (0.02) | Newcol 723 (0.08) | 40 | 37.5 | Example 2 |
| | | Coatamine 24P (0.04) | Newcol 723 (0.04) | 30 | 50.0 | Example 3 |
| | | Coatamine 24P (0.04) | Newcol 569E (0.08) | 40 | 37.5 | Example 4 |
| OFPR-800 | 2.5% | None | None | 180 | 8.3 | Comparative Example 2 |
| | *2 TMAH aqueous solution 3.0% | None | None | 250 | 6.0 | Comparative Example 3 |
| | 2.5% | Hexadecyltrimethylammonium chloride (0.08) | Newcol 565 (0.04) | 50 | 30.0 | Example 5 |
| | 3.0% | Coatamine 249 (0.04) | Newcol 723 (0.04) | 20 | 75.0 | Example 6 |
| | | None | None | 210 | 7.1 | Comparative Example 4 |
| Microposit 1400-27 | Choline 5.02 (wt. %) | Dodecylpyridinium chloride | Newcol 723 (0.04) | 40 | 37.5 | Example 7 |
| | | Position BB (0.02) | Emalgen A-500 (0.04) | 20 | 70.0 | Example 8 |

*1 Selectivity = (Exposed portion developing speed)/(Nonexposed portion developing speed)
*2 TMAH: Tetramethylammonium hydride As is apparent from Table 1, the dissolution rate of the nonexposed portion is low to provide high selectivity of the exposed portion with respect to the nonexposed portion when the developers of Examples 1 to 8 are used as compared with the developers of Comparative Examples 1 to 4.

The relationship between the film remaining rate and the dose of the resist was checked, and test results are shown in FIG. 1. Line a in FIG. 1 shows results of Example 1, and line b shows results of Comparative Example 1. As is apparent from FIG. 1, when the developer of the present invention is used, the remaining rate of the exposed portion is high, thus obtaining a pattern with good contrast.

Figure 2A:
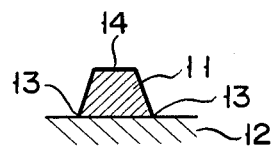
FIGS. 2A and 2B are sectional views showing resist patterns formed with the developer of the present invention and the conventional developer.
Figure 2B:
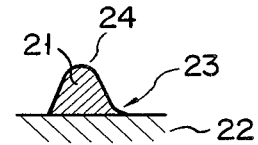

In the resist pattern prepared in Example 1, trailing does not occur between boundary edge 13 of a pattern 11 and a support 12, as shown in FIG. 2A. A decrease in film thickness at resist top surface 14 is small, surface 14 is smooth, and the corners are sharp. However, in the resist pattern prepared by Comparative Example 1, as shown in FIG. 2B, trailing 23 occurs between the boundary edge of pattern 21 and support 22. A decrease in film thickness at resist top surface 24 is large, and the corners are rounded.

As described above, the developer of the present invention can limit dissolution of the nonexposed portion of the positive resist. At the same time, the dissolution selectivity of the exposed portion to the nonexposed portion is high. By using the developer of the present invention, inclined footing can be prevented, and a sharp resist pattern can be formed. The developer of the present invention can be effectively used for forming a positive resist pattern having a line width of 1.5 μm or less, particularly 1 μm or less.

What is claimed is:

1. A positive resist developer comprising an aqueous solution containing:

a quaternary ammonium hydroxide acting as an active developing agent in an amount sufficient to develop a positive resist, wherein said quaternary ammonium hydroxide is represented by the general formula:

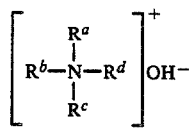

wherein $R^a$ and $R^c$ are respectively alkyl groups each having 1 to 4 carbon atoms, and $R^d$ is an alkyl group having 1 to 4 carbon atoms or a hydroxyalkyl group having 1 to 3 carbon atoms;

a cationic surfactant in an amount sufficient to suppress dissolution of a non-exposed portion of the positive resist, wherein said cationic surfactant is represented by the following general formula:

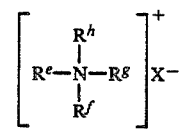

wherein $R^e$ is an alkyl group having 8 to 18 carbon atoms, $R^f$ and $R^h$ are respectively alkyl groups each having 1 to 4 carbon atoms, $R^g$ is an alkyl group having 1 to 4 carbon atoms or a hydroxyalkyl group having 1 to 4 carbon atoms, and X is a halogen atom, or by the general formula:

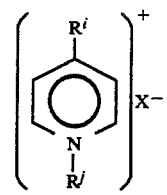

wherein $R^j$ is an alkyl group having 12 to 16 carbon atoms, $R^i$ is a hydrogen atom or methyl group, and X is halogen atom; and a water-soluble nonionic surfactant in an amount sufficient to prevent trailing of the positive resist and roughening of a resulting resist pattern during development thereof, wherein said nonionic surfactant is selected from the group consisting of polyoxyethylene ethers and esters of fatty acids of polyhydric alcohols of the following general formulas:

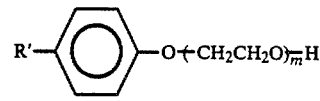

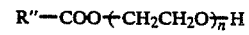

wherein R and R'' are respectively alkyl groups each having 12 to 18 carbon atoms, R' is an alkyl group having 8 or 9 carbon atoms, and m and n are the numbers of the respective repeating units.

2. A positive resist developer comprising an aqueous solution containing:

a quaternary ammonium hydroxide acting as an active developing agent in an amount sufficient to develop a positive resist, wherein said quaternary ammonium hydroxide is represented by the general formula:

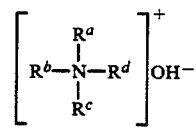

wherein $R^a$ to $R^c$ are respectively alkyl groups each having 1 to 4 carbon atoms, and $R^d$ is an alkyl group having 1 to 4 carbon atoms or a hydroxyalkyl group having 1 to 3 carbon atoms;

a cationic surfactant in an amount sufficient to suppress dissolution of a non-exposed portion of the positive resist, wherein said cationic surfactant is represented by the general formula:

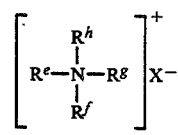

wherein $R^e$ is an alkyl group having 8 to 18 carbon atoms, $R^f$ and $R^h$ are respectively alkyl groups each having 1 to 4 carbon atoms, $R^g$ is an alkyl group having 1 to 4 carbon atoms or a hydroxyalkyl group having 1 to 4 carbon atoms, and X is a halogen atom; and a water-soluble nonionic surfactant in an amount sufficient to prevent trailing of the positive resist and roughening of a resulting resist pattern during development thereof, wherein said nonionic surfactant is selected from the group consisting of polyoxyethylene ethers and esters of fatty acids of polyhydric alcohols of the following general formulas:

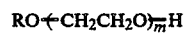

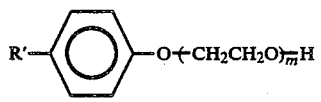

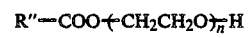

wherein R and R" are respectively alkyl groups each having 12 to 18 carbon atoms, R' is an alkyl group having 8 or 9 carbon atoms, and m and n are the numbers of the respective repeating units.

* * * * *